United States Patent
Ho et al.

(10) Patent No.: US 7,129,729 B2
(45) Date of Patent: Oct. 31, 2006

(54) SOCKET CONNECTION TEST MODULES AND METHODS OF USING THE SAME

(75) Inventors: Swee Cheng Ho, Butterworth (MY); Teik Sean Toh, Kedah (MY); Tzyy Haw Tan, Penang (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/223,249

(22) Filed: Sep. 6, 2005

(65) Prior Publication Data
US 2006/0006894 A1    Jan. 12, 2006

Related U.S. Application Data

(62) Division of application No. 10/641,916, filed on Aug. 15, 2003, now Pat. No. 6,956,387.

(51) Int. Cl.
*G01R 31/02* (2006.01)

(52) U.S. Cl. ........................................... 324/755
(58) Field of Classification Search ............... None
See application file for complete search history.

(56) References Cited

U.S. PATENT DOCUMENTS

| | | | | |
|---|---|---|---|---|
| 5,475,317 A | 12/1995 | Smith | | 324/760 |
| 5,811,977 A | 9/1998 | Rouchard | | 324/538 |
| 5,966,020 A | 10/1999 | Rampone et al. | | 324/755 |
| 6,291,978 B1 | 9/2001 | Chandler et al. | | 324/763 |
| 6,734,683 B1 | 5/2004 | Hash | | 324/538 |
| 6,888,235 B1* | 5/2005 | Lopata et al. | | 257/691 |
| 6,956,387 B1* | 10/2005 | Ho et al. | | 324/755 |
| 2005/0207131 A1* | 9/2005 | Prokofiev et al. | | 361/760 |
| 2005/0225315 A1* | 10/2005 | Goldsmith et al. | | 324/158.1 |
| 2005/0242823 A1* | 11/2005 | Parker | | 324/530 |
| 2006/0006893 A1* | 1/2006 | Ho et al. | | 324/755 |

OTHER PUBLICATIONS

Snogren, Richard, Embedded Passives: The Next Revolution, PC Fab, pcfab.com, Nov. 2002, pp. 26-29.
Agilent TestJet Technology White Paper, Agilent Technologies, http://we.home.agilent.com/cgi-bin/bvpub/agilent/editorial/cp_MiscEditorial.jsp?NAV_I . . . , Dec. 14, 2004, 1 page.
Chapter 3: Agilent TestJet, Optical Board Test Applications, © Agilent Technologies 2001, pp. 3-2 through 3-9 and 3-71 through 3-73.

* cited by examiner

*Primary Examiner*—Jermele Hollington
(74) *Attorney, Agent, or Firm*—Blakely, Sokoloff, Taylor & Zafman LLP

(57) ABSTRACT

Test modules, systems, and methods employing capacitors for the testing of the solder joint connections between a printed circuit board (PCB) and a socket of a device are presented in embodiments of the current invention. A test module having capacitors in parallel, and in particular embedded capacitors, can be used to test tied traces and their solder joint connections by measuring the total capacitance of the capacitors. Embodiments of the current invention present no-power tests that can be used with a variety of testing platforms and test fixtures, such as in-circuit testing (ICT) and manufacturing defect analysis (MDA.) Additionally, the test module can be used with a variety of sockets, such as a ball grid array, a pinned grid array, and a land grid array.

12 Claims, 3 Drawing Sheets

SOCKET CONNECTION TEST MODULES AND METHODS OF USING THE SAME

The present Pat. application is a Divisional of Application No. 10/641,916, filed Aug. 15, 2003, now U.S. Pat. No. 6,956,387.

BACKGROUND OF THE INVENTION

1. Field of the Invention

Embodiments of the present invention relate to the field of testing electrical connections and traces of an electronic device and a printed circuit board. More particularly, embodiments of the present invention relate to the use and integration of parallel capacitors with external or embedded capacitors in a test module to test the connections between a printed circuit board, or a motherboard, and a device socket.

2. Discussion of Related Art

It is valuable to be able to test the electrical connections between the sockets of electronic devices and a printed circuit board (PCB) or motherboard, as well as the integrity of the traces within the testing equipment, socket, and PCB. The inspection of the socket connections to a PCB is valuable because open solder joints, broken pins, springs, or other poor connections on any of the signal connections may result in the processor malfunctioning, or failing to boot altogether. Openings on the power and ground connections may cause the processor to malfunction under a heavy load, cause hot spots due to excessive current in the connected power and ground pins, or cause reliability issues over time at the customer end.

The type of socket used varies based on how a device is designed to connect to a socket and a PCB. In the past, devices were typically connected to a socket and a PCB by through pins. Therefore, pinned grid array sockets having pins were used. Devices have evolved from through board pins to the surface mounting of a device to a socket and PCB. A device that is designed to be surface mounted has pads, or flat conductive discs, on its packaging. For a ball grid array (BGA) device there will be solder bumps on the pads for connection with a BGA socket. The solder bumps typically fit into grips on a BGA socket for connection to a PCB. A land grid array (LGA) device only has pads. The pads of an LGA require a socket containing springs or some other type of conductive trace to connect the device to the PCB. Human visual inspection of the solder joints within a BGA socket or the conductive traces within a LGA socket is not possible. Therefore, test modules that connect to the socket to test its connection to a PCB have been developed.

Testing the connections between a socket and a PCB can be performed in a number of ways. The testing methods can be divided into two groups. One group is the "power-up" tests that require powering up the board and device. The other group is the "no-power" tests that do not require powering up the board and devices. In a "no-power" test only the equipment that is used for transmitting or receiving an electrical signal has power. The "no-power" tests are preferred because they do not require turning on the individual devices on a PCB or extensive knowledge about the devices in order to determine that the correct device has been properly connected, oriented, and soldered. "No-power" tests also offer the advantages of testing connections during assembly and of compatibility with both in-circuit testers (ICT) and Manufacturing Defect Analyzer (MDA) testers. Compatibility with MDA testers is valuable because they are widely used by Far East board manufacturing.

One prevalent "no-power" test is the Agilent™ TestJet™ technique. This technique takes advantage of the lead frame present in most socket connectors. The lead frame is a metal framework that includes the devices input, output, and power traces and their extensions up to the point where an IC or a socket connector is attached. As used in this description, the term trace refers to the conductive element (like a wire or pin) within a component such as a PCB or a socket. The size and shape of the lead frame is fairly consistent between devices and vendors. The TestJet™ technique for testing socket connections uses a test module adapted to the particular type of socket to be tested (for example, if a pin grid array socket is being tested the test module will have pins) and an external sensing plate that is suspended above the socket, and separated from the lead frame. The lead frame and the external plate form a small capacitance that can be measured by the ICT or MDA testers via the application of an AC source. Because each socket connection between a socket and a PCB consists of a part of the lead frame, each connection can be detected as a separate capacitance value for testing purposes.

When a socket connection is not properly connected to the PCB there will be an additional capacitor in series with the TestJet™ capacitor. This additional capacitance exists because there is a tiny air gap within the socket connection trace. The series combination of the TestJet™ capacitor and this additional pin capacitor is smaller than either capacitor. Therefore, the TestJet™ technique measures the capacitance at each socket connection, and identifies each socket connection that has a capacitance smaller than the expected capacitance for that socket connection. By this technique, poor connections and traces within the PCB and socket can be detected. But, the Testjet™ technique has limitations in its ability to detect traces (or pins) within the PCB that are tied, such as the commonly tied power or ground traces. This is because the TestJet™ tests in serial mode, testing one trace at one socket connection at a time. If the trace being tested is a tied trace that is broken or has an open solder joint, the test signal will still go through, and the expected capacitance will be read for the tied trace being tested, even if only one of the tied traces is intact and has a good solder joint. The TestJet™ can thus fail to detect broken traces or open solder joints on tied traces. The TestJet™ also has difficultly detecting weak signals due to shorter signal propagation paths in current generations of sockets.

Another testing device that could be used to detect the integrity of electrical connections and traces is the FET TCT (Field Effect Transistor Through Connector Testing) (Published patent application US 2003/0057981 A1, Assigned to Intel Corporation). The FET TCT is a "power-up" test because it requires the board under test (BUT) to be properly powered-up prior to testing. The FET TCT consists of an array of FET pairs on a test module. One FET in such a pair connects a single signal trace to a single power trace and the other FET connects the signal trace to a single ground trace. Multiple FET pairs are used to connect all signal traces to independent power and ground traces. The gates of the high side FETS are connected to a common control trace within the test module and the gates of the low side FETS are connected to a second control trace within the test module. When the control signal for the high side FET is driven high by the tester, a continuity path should exist through the power trace, the high side FET, and back through the signal trace. If all traces were soldered properly, a digital high state should be measured on the signal traces when the high side FET's are active. When the control signal for the low side FET is driven high by the tester, a continuity path should exist through the signal trace, the low side FET, and back through the ground trace. If all traces were soldered properly, a digital low state would be measured on the signal trace, or the power/ground trace used by that FET pair.

Although the FET TCT can detect the solder connections and traces of tied signal and ground traces, it requires an attachment to every signal, ground, and power trace. Because of this requirement, the FET TCT must have a large footprint that can cause fixture design issues and difficulty of use. As the number of traces increases and devices are further scaled down, the FET TCT will become even larger and more difficult to use. Additionally, the FET TCT is a power-up test that is only compatible with an in-circuit tester and not an MDA tester type that is widely used by Far East board manufacturing. The FET TCT is also not easily compatible with a land grid array (LGA) CPU because an LGA is typically quite fragile and a bulky FET TCT test module could cause significant harm.

DETAILED DESCRIPTION OF THE PRESENT INVENTION

Embodiments of the present invention provide methods and devices employing capacitors for testing the integrity of the electrical connections between a printed circuit board (PCB) and a socket of a device as well as the traces within the PCB and socket. In the following description, numerous specific details are set forth. One of ordinary skill in the art, however, will appreciate that these specific details are not necessary to practice embodiments of the invention. While certain exemplary embodiments of the invention are described and shown in the accompanying drawings, it is to be understood that such embodiments are merely illustrative and not restrictive of the current invention, and this invention is not restricted to the specific constructions and arrangements shown and described because modifications may occur to those ordinarily skilled in the art.

Described herein are embodiments of test modules, systems, and methods employing capacitors for the testing of the connections between a printed circuit board (PCB) and a socket of a device as well as the integrity of electrical traces. As used in this description, the term trace refers to the conductive element (like a wire or pin) within a component such as a PCB or a socket. The connections between a PCB and a socket can be solder joints, pins, or some other conductive element within a socket. A test module having capacitors, and in particular embedded capacitors, can be used to test the connections between a socket and the tied and untied traces of a PCB.

The integrity of an untied trace within a PCB can be tested by measuring the capacitance of a capacitor in series with an untied trace, and the integrity of tied traces can be tested by measuring the total capacitance of capacitors in parallel with one another and coupled to the tied traces. Embodiments of the current invention present no-power tests that can be used with a variety of testing platforms and test fixtures, such as in-circuit testing (ICT) and manufacturing defect analysis (MDA). Additionally, the test module can be designed for use with a variety of sockets, such as a ball grid array, a pin grid array, and a land grid array.

Figure 1:
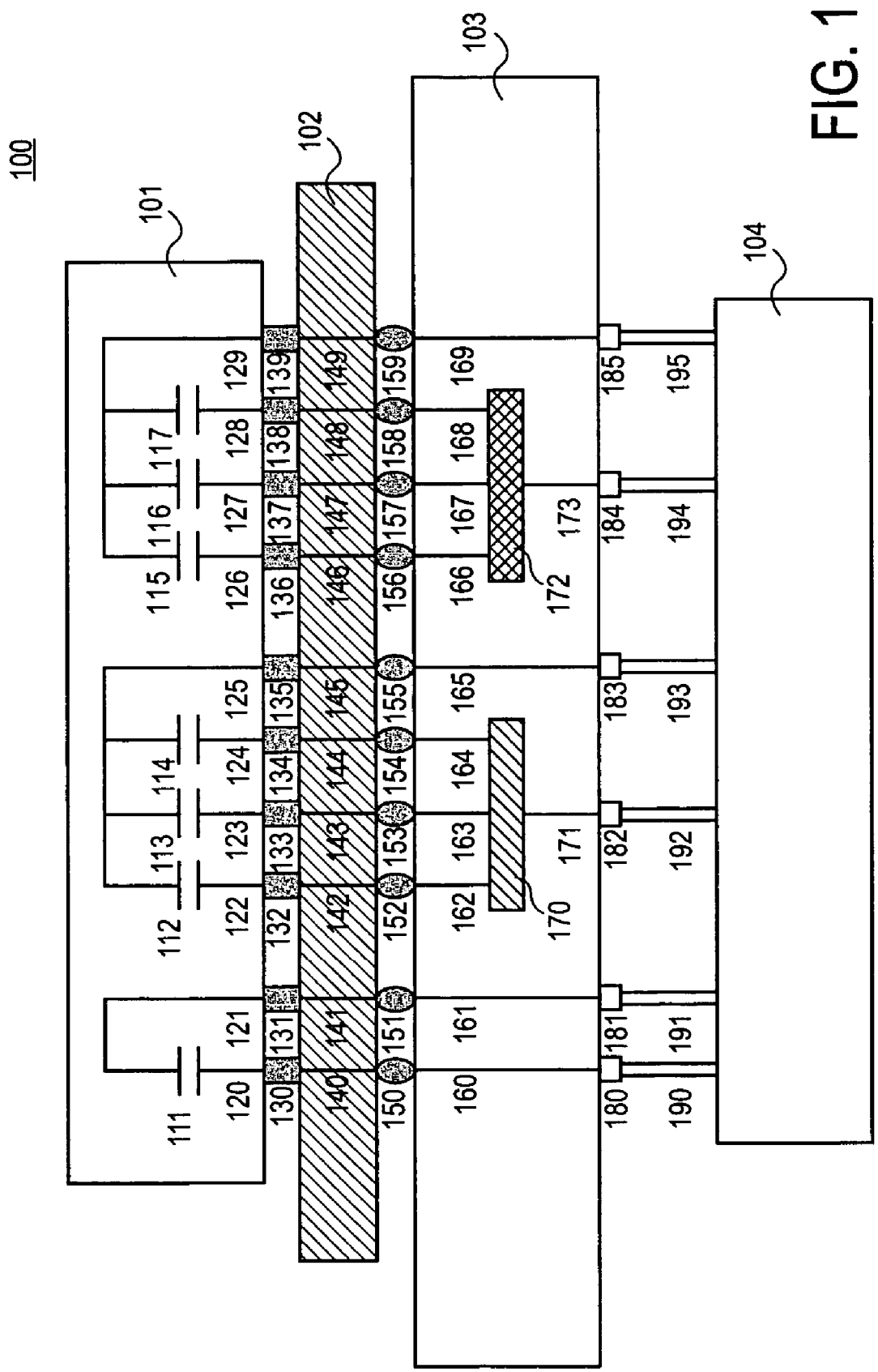
FIG. 1 is an illustration of a cross-sectional view of a test system including a test module having embedded capacitors in parallel.
Figure 2:
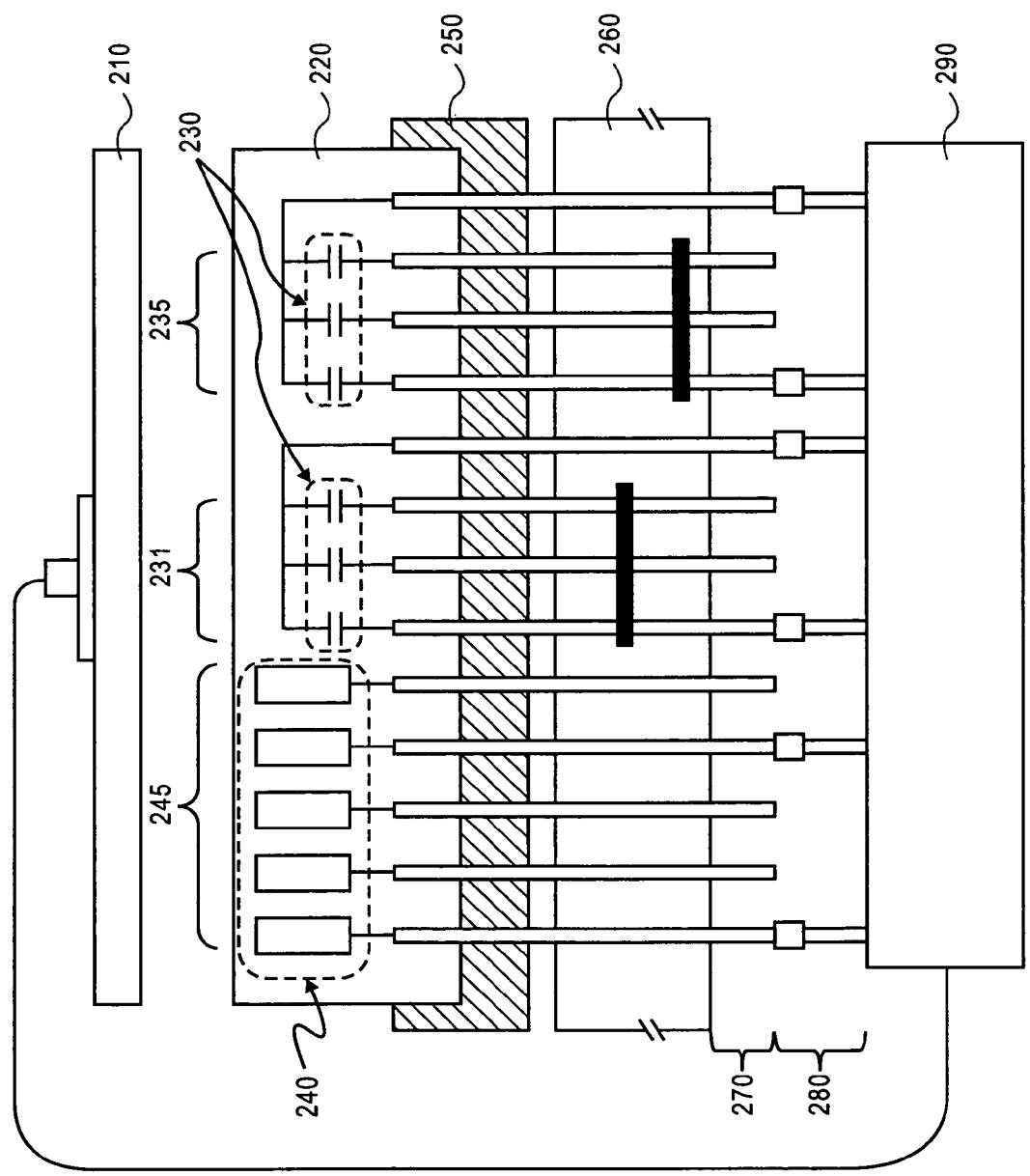
FIG. 2 is an illustration of cross-sectional view of a test system including a test module having capacitors in parallel and having extended traces.

FIG. 1 illustrates a cross section of an embodiment of a test system 100 that includes a test module 101, a BGA socket 102, a motherboard 103, and a test fixture 104. The test module 101 has several traces, 120–129, that connect to test module connection points 130–139 and to the embedded capacitors 111–117. Embedded capacitors are capacitors that are embedded into a substrate. The substrate can be any type of insulator material, but in particular any type of fiber glass material such as FR4 (fire redundant), FR5, and Getek. These are all fiberglass material with different compositions. The size of the embedded capacitors is dependent on the PCB or motherboard manufacturer design. In an alternate embodiment, the embedded capacitors 111–117 can be SMT (Surface Mount Technology) capacitors mounted externally on the substrate surface of the test module 101. The SMT capacitors can be sizes such as 0603 farads, 0402 farads, and 0201 farads. For example, 0402 means 40 mils length×20 mils width. Because the embedded capacitors or the SMT capacitors can have very small dimensions, the footprint of the test module 101 can also be very small and adapted to test a variety of sockets.

The BGA socket 102 has traces 140–149 to which the test module connection points 130–139 are connected. The test module 101 can be adapted to test a broad range of sockets. FIG. 1 illustrates a ball grid array socket 102 for a CPU. Other types of sockets such as a pin grid array and a land grid array could also be tested. The flexibility of the design of the test module 101 is valuable because it can be designed to test a variety of different sockets. One alternate socket is the land grid array (LGA) socket, which can be tested by an embodiment of a test module of the present invention without the use of an adapter to make the socket compatible with most test modules. Avoiding the use of an adapter is valuable because LGA sockets are typically fragile and have a large number of connection points (such as springs or a conductive composite). Additionally, a test module 101 employing embedded capacitors or SMT capacitors can have a small footprint, thereby reducing the weight exerted on the socket by the module. The socket tested can be for different types of devices such as a central processing unit (CPU), an accelerated graphics port (AGP), a peripheral component interconnect (PCI), a dual in-line memory module (DIMM), a dynamic random access memory (DRAM), and a communication and network riser (CNR).

The motherboard 103 has traces 160–169 that are connected to the traces 140–149 of the BGA socket 102 by solder joints 150–159. The motherboard 103 also contains power plane 170 that ties the power traces 162, 163, and 164 to the trace 171, and the ground plane 172 that ties the ground traces 166, 167, and 168 to the trace 173. The motherboard 103 can alternately be any type of PCB, or "card." The traces 160, 161, 171, and 173 of the motherboard 103 are connected to the test fixture 104 through test points 180–185 and through test probes 190–195. If a socket using through pins is employed, such as a pin grid array, then the testpoints would instead be connector leads. The test fixture 104 is used to send test signals through the tester probes and into the motherboard 103, socket 102, and test module 101. The test fixture is also used to receive and measure the test signals after they have gone through the test system.

In an embodiment of the present invention, the solder joints 150–159 and the electrical traces throughout the circuits formed by the test system 100 are tested by the method of sending a test signal from the test fixture 104 into a circuit including at least one capacitor that is formed by the test system 100. To test untied traces, a circuit is formed within the test system 100 that includes an untied trace and a capacitor in series with the untied pin. For example, in an embodiment of the current invention, the untied traces within the motherboard 160 and 161 are tested by sending an input signal from the test fixture 104 through the tester probe 191 through the circuit formed by test point 181, motherboard trace 161, solder joint 151, socket trace 141, test module connection point 131, test module trace 121, embedded capacitor 111, test module trace 120, test module connection point 130, socket trace 140, solder joint 150, motherboard trace 160, test point 180, and tester probe 190. The input signal is typically around 1 kHz and can be analog (A/C) or digital. In either case, the motherboard does not need to be powered up. The capacitance of the capacitor 111 is received and measured by the test fixture 104. Depending on the board design, the capacitance can be anywhere from the femtofarad range up to the microfarad range. If the measured capacitance is less than expected it will signal an open on one of the solder joints 150 or 151, a broken trace, or a poor connection somewhere along the trace formed by the circuit between the tester probes 190 and 191. Please note that the input signal could also have been sent through the circuit from the tester probe 190.

The method of testing tied traces is similar except that multiple traces in parallel and multiple capacitors in parallel are present in the circuit formed in the test system 100, and a total capacitance is measured by the test fixture 104. In an embodiment of the present invention, the tied power traces 162, 163, and 164 within the motherboard 103 are tested by sending an input test signal from the test fixture 104 into a circuit formed in the test system 100 by the tester probe 193, the testpoint 183, the signal trace 165 that runs through the motherboard 103, the solder joint 155, the socket trace 145, the test module connection point 135, the test module trace 125, the embedded capacitors in parallel 112, 113, and 114, the test module traces in parallel 122, 123, and 124, the test module connection points 132, 133, and 134, the socket traces 142, 143, and 144, the solder joints 152, 153, and 154, the tied motherboard traces in parallel 162, 163, and 164, the power plane 170, the trace 171, the test point 182, and the tester probe 192. The total capacitance is then received and measured by the test fixture 104. By measuring the total capacitance of the parallel capacitors 112, 113, and 114, the integrity of the individual power traces in the tied trace arrangement can be determined. If the total capacitance value is less than expected it will signal that there is an open solder joint, a broken trace, or a poor connection somewhere along the trace formed by the circuit between the tester probes. Also, the total capacitance measured for tied power traces can be split into a smaller group to provide better test result and better diagnostic capabilities. For example, if there are 20 power traces tied together, instead of measuring the total capacitance of 20 parallel capacitors, the test fixture can split them into two tests of 10 parallel capacitors each. Testing smaller groups of tied pins will make it easier to determine which trace has an open or a defect.

The tied ground traces 166, 167, and 168 can be tested in the same way as the tied power traces. An input test signal is sent from the test fixture 104 into a circuit formed by test probe 194, testpoint 184, signal trace 169 that runs through the motherboard 103, the solder joint 159, the socket trace 149, the test module connection point 139, the trace within the test module 129, the embedded capacitors in parallel 115, 116, and 117, the test module traces in parallel 126, 127, and 128, the test module connection points 136, 137, and 138, the socket traces 146, 147, and 148, the solder joints 156, 157, and 158, the motherboard traces 166, 167, and 168, the ground plane 172, the trace 173, the testpoint 184, and the tester probe 194. By testing the total capacitance of the capacitors in parallel in this circuit, the integrity of the tied traces and their solder joints can be determined. The total capacitance measured for tied ground pins can be split into a smaller group to provide better result and better diagnostic capability.

In a preferred embodiment, the test module 220 will have extended traces on the signal pins 245 to form enlarged signal surfaces 240. The use of extended traces will amplify the capacitance value with the external capacitor plate 210 according to the equation $C = eA/d \times 8.85 \times 10^{-12}$ Farad, where the length of the traces is "d". The extended traces will thus greatly improve the detection of weak signals, and are of particular use with device sockets having short traces, such as a land grid array socket. The extended traces have a length dependent on the three variables in the above equation. Those variables being the area of the capacitor (A) and (d) the distance in between the sensor plate and the signal surface. Additionally, the length of the traces is dependent on the type of socket and board used. In most circumstances, the traces of the enlarged signal surfaces will have lengths of between 10 mm and 100 mm. Extended traces are valuable in testing boards and devices having short traces, and can be used in combination with already existing TestJet™ equipment and methodology. Additionally, it is a no-power test, which means that it can be used with both ICT and MDA testers.

The test module 220 is cradled in a connector 250 that can be a socket for a CPU, an AGP, a PCI, a CNR, a DIMM, or similar devices requiring sockets. The connector 250 is coupled to the printed circuit board (PCB) 260, or alternately a motherboard, by the through pins 245, 231, and 235. Alternately, if the socket is a ball grid array, the connector 250 can be coupled to the PCB 260 by solder joints. Test probes 280 are coupled to the board 260 by connector leads 270, or alternately, testpoints if the connector 250 has a ball grid array socket. The test probes 280 are coupled to the test fixture 290, which can be an ICT or an MDA.

The integrity of the tied pins such as tied power pins 231, and the tied ground pins 235, is measured using the embedded capacitors in parallel as described in the above embodiment. The integrity of the untied signal pins 245 is determined by measuring the capacitance created by the external capacitor plate 210, which can be a TestJet™ sensor plate, and the enlarged signal surfaces 240. The capacitance created will indicate whether the signal pins 245 are broken, have open solder joints (if through pins are not used), or have poor connections. If a pin is broken or there is an open solder joint, an additional capacitance will be created by the tiny air gap. The series combination of the capacitor created by the external capacitor plate 210 and the enlarged signal surfaces 240 and the additional capacitor created by an open or breakage of a pin is smaller than either capacitor. An open solder joint or broken pin will also be indicated if no capacitance, a negative capacitance, or a low capacitance is measured by the test fixture 290. A negative or low capacitance as the test result would mean that the AC signal is not being properly propagated to the external capacitor plate 210. Therefore, each signal pin that has no capacitance, or a capacitance value smaller than expected for that pin, can be identified as having a problem.

In another embodiment of the present invention, a test module combines parallel embedded capacitors with a field effect transistor through connector tester (FET TCT). The embedded capacitors are to test the connections of tied pins (power, ground, and signal) or untied power and ground pins. The FET TCT is to test the connections of untied signal pins. The footprint of a FET TCT test module is reduced by using parallel embedded capacitors to test the tied pins of a device socket. This combination of a FET TCT and parallel embedded capacitors also does not require that the board be powered up and a simple analog or digital test methodology can be used, making the test module compatible with a greater range of testers. The board does not need to be powered up because the power and ground pins, that would require power on the board with a FET TCT, are tested using the embedded capacitor methodology that does not require powering up the board. Also, the signal pins can be tested by the FET TCT testing methodology without powering up the board. The FET TCT test methodology can be a no-power test for signal pins and still detect manufacturing defaults such as open, missing, and poor solder joints.

Figure 3:
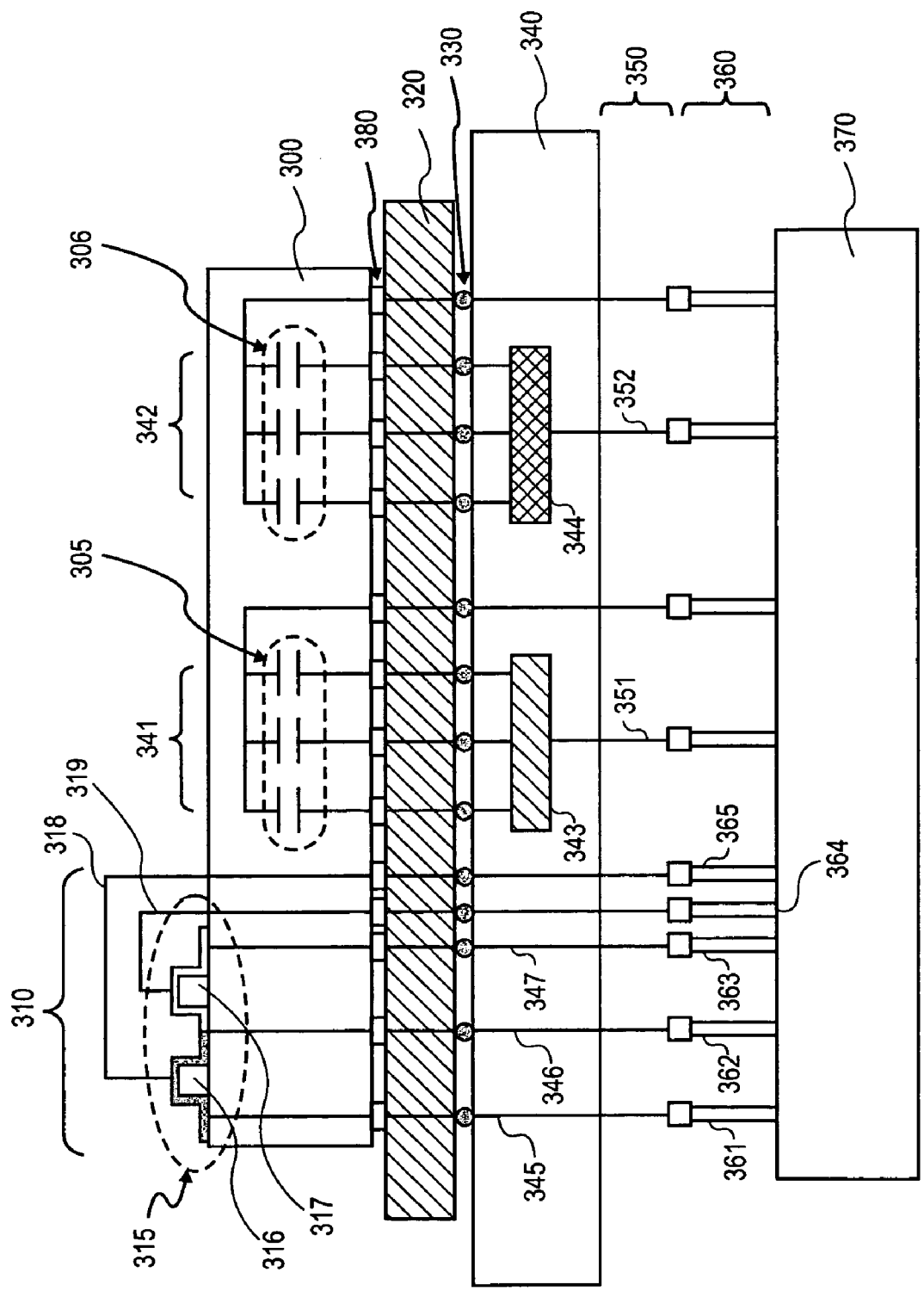
FIG. 3 is an illustration of a cross-sectional view of a test system including a test module having capacitors in parallel and a pair of switching devices, in this case FET's.

This embodiment is illustrated in FIG. 3. In this embodiment a ball grid array (BGA) socket is used. The test module 300 includes two sets of embedded capacitors in parallel, 305 and 306. The test module also includes a FET TCT that includes at least one FET pair 315 comprising a first FET 316 and a second FET 317. Although FET's are used in a preferred embodiment, any switching device can be employed. The first FET 316 is connected to a first control trace 318 by its gate electrode, and the second FET 317 is connected to a second control trace 319 by its gate electrode. The test module 300 is coupled to the traces of a device socket 320, such as a CPU socket, through the test module connection points 380. In this embodiment of the invention, the first FET 316 is coupled by a source or a drain region to the first signal trace 345 that runs through the PCB 340 and the socket 320, and by a source/drain junction to the second signal trace 346 that runs through the PCB 340 and the socket 320. The second FET 317 is similarly coupled to the second signal trace 346 and the third signal trace 347. The embedded capacitors in parallel 305 in the test module 300 are coupled to the tied power traces 341 and the embedded capacitors in parallel 306 are coupled to the tied ground traces 342. The device socket 320 has a ball grid array, although it could also be a land grid array or a pinned grid array. The device socket 320 is coupled by solder joints 330 to a printed circuit board (PCB) 340. The PCB 340 can also be a motherboard. In the PCB 340, the tied power traces 341 are tied by the power plane 343 and are in series with the connector lead 351. The tied ground traces 342 are tied by the ground plane 344 and are in series with the connector lead 352. Connector leads 350 protrude from the board 340 and can be coupled to tester probes 360. The tester probes 360 are coupled to a fixture 370, which can be an in-circuit tester (ICT) or a manufacturing defect analyzer (MDA).

Tied traces such as tied power traces 341 and tied ground traces 342 can be tested by the embedded capacitors in parallel 305, and 306, as described above. Untied signal traces such as the untied signal traces 345, 346, and 347 are tested by the FET TCT pair 315. Multiple FET pairs can be in an array to connect to all of the signal traces that need to be tested. FIG. 3, for the sake of simplicity, illustrates only three signal traces (345, 346, and 347), but it is to be understood that there can be many more. To test the untied signal traces 345, 346, and 347, the two FET's in the FET TCT pair are activated separately. The first FET 315 is a high side FET connected to first signal trace 345 by a source region, and to second signal trace 346 at a source/drain junction, and to the control trace 318 by its gate electrode. If there is an array of FET TCT's to test other signal traces, the high side FET's in each of those pairs will also be connected to the control trace 318, so that many signal traces can be tested at once. The tester will send a control signal through test probe 364 to the control trace 318 to the FET 315 and to any other FET's connected to the control trace in the array. This will create a continuity path through the first signal trace 345, the FET 315, and the second signal trace 346. Once a control signal is sent from control trace 365 to the gate electrode of FET 315 a continuity path is created between the test fixture 370, test probe 361, PCB trace 345, through the drain/source region of the FET 315, and then back through the source/drain region of FET 315 to PCB trace 346, test probe 362, and the test fixture 370. A test signal from the test fixture 370 can be sent through this path to be received and measured by the test fixture 370. Other FET's attached to control trace 315 in the array will experience a similar continuity path. If all of the signal traces are soldered properly, an electronic high state (either digital or analog) will be measured on the signal traces 345 and 346 by the test probes 361 and 362 when the FET is active.

Similarly, the low side FET 316 in the FET TCT pair 310 will test the signal traces 345 and 346. A control signal is sent by the test fixture 370 through the test probe 365 to the control trace 318. The control trace 318 would be coupled to all other low side FET's on their gate electrodes in a FET TCT array. When the control signal for the low side FET 316 is driven high by the tester, a continuity path should exist through signal trace 346 attached to the source/drain junction, the gate electrode of the FET 316, and the signal trace 347 attached to the drain of FET 316. If the signal traces 346 and 347 are soldered properly, an electronic low state (analog or digital) will be measured by the test probes 362 and 363 on the signal traces 346 and 347, respectively.

Thus, what have been described are embodiments of a test system, a test module, and methods of using the same to test the solder joints between a device socket and a printed circuit board. In the foregoing detailed description, the embodiments of the present invention are exemplary and it will be evident that various modifications and changes may be made thereto without departing from the broader spirit and scope of the present invention. The present specification and figures are accordingly to be regarded as illustrative rather than restrictive.

The invention claimed is:

1. A system for socket testing comprising:
    a socket having socket traces connected to board traces in a circuit board, the board traces including tied traces;
    a module comprising capacitors in parallel with one another to test connections between the socket traces and the board traces, the module electrically attachable to the socket; and
    a test fixture electrically connected to the socket traces through the circuit board and supplying test signals to detect open connections on the socket traces.

2. The system of claim 1 wherein the socket is one of a ball grid array socket, a land grid array socket, and a pin grid arrary socket.

3. The system of claim 1 wherein the tied traces are selected from the group consisting of power traces and ground traces.

4. The system of claim 1 wherein the board traces further include untied signal traces.

5. The system of claim 4 further comprises:
    an external capacitor plate.

6. The system of claim 5 wherein the module further comprises:
    extended traces connected to the united signal traces.

7. The system of claim 4 wherein the module further comprises:
a switching device connected to the united signal traces.

8. The system of claim 7 wherein the switching devices comprises:
a field effect transistor through connector tester (FET TCT) including a pair of FETs.

9. The system of claim 1 wherein the test fixture is an in-circuit tester or a manufacturing defect analyzer.

10. A system for socket testing comprising:
a socket having socket traces connected to board traces in a circuit board, the board traces including united signal traces, tied ground traces, and tied power traces;
an external capacitor plate;
a test module comprising extended traces that are connectable to the untied signal traces and embedded capacitors in parallel that are connectable to the tied ground traces and the tied power traces; and
a test fixture electrically connected to the socket traces through the circuit board and supplying test signals to detect open connections on the socket traces.

11. The system of claim 10 wherein the socket one of a ball grid arrary socket, a land grid arrary socket, and a pin grid arrary socket.

12. The system of claim 10 wherein the test fixture is one of an incircuit tester and a Manufacturing Defect Analyzer.

* * * * *